(12) United States Patent
Fauer et al.

(10) Patent No.: US 8,154,846 B2
(45) Date of Patent: Apr. 10, 2012

(54) FEEDTHROUGH CAPACITOR ASSEMBLIES

(75) Inventors: Franz Fauer, Vienna (AT); Christoph Kopp, Matzen (AT)

(73) Assignee: Astec International Limited, Kwun Tong, Kowloon (HK)

( * ) Notice: Subject to any disclaimer, the term of this patent is extended or adjusted under 35 U.S.C. 154(b) by 366 days.

(21) Appl. No.: 12/476,283

(22) Filed: Jun. 2, 2009

(65) Prior Publication Data

US 2010/0302702 A1 Dec. 2, 2010

(51) Int. Cl.
*H01G 4/35* (2006.01)
*H01G 4/228* (2006.01)
*H01G 4/38* (2006.01)
*H01G 4/236* (2006.01)

(52) U.S. Cl. ............ 361/302; 361/306.1; 361/307; 361/328; 361/329

(58) Field of Classification Search .......... 361/302, 361/306.1, 307, 328, 329
See application file for complete search history.

(56) References Cited

U.S. PATENT DOCUMENTS

| | | | |
|---|---|---|---|
| 3,617,830 A | 11/1971 | Perna, Jr. | |
| 4,314,213 A * | 2/1982 | Wakino | 333/182 |
| 4,424,551 A * | 1/1984 | Stevenson et al. | 361/302 |
| 4,514,782 A * | 4/1985 | Sakamoto et al. | 361/302 |
| 4,554,608 A * | 11/1985 | Block | 361/119 |
| 4,675,629 A | 6/1987 | Sakamoto et al. | |
| 5,040,091 A * | 8/1991 | Yamaoka et al. | 361/302 |
| 5,650,759 A * | 7/1997 | Hittman et al. | 333/182 |
| 5,896,267 A * | 4/1999 | Hittman et al. | 361/302 |
| 5,905,627 A * | 5/1999 | Brendel et al. | 361/302 |
| 5,959,829 A | 9/1999 | Stevenson et al. | |
| 5,973,906 A * | 10/1999 | Stevenson et al. | 361/302 |
| 5,999,398 A * | 12/1999 | Makl et al. | 361/302 |
| 6,008,980 A * | 12/1999 | Stevenson et al. | 361/302 |
| 6,424,234 B1 * | 7/2002 | Stevenson | 333/182 |
| 6,456,481 B1 * | 9/2002 | Stevenson | 361/302 |
| 6,515,842 B1 * | 2/2003 | Hayworth et al. | 361/303 |
| 6,529,103 B1 * | 3/2003 | Brendel et al. | 333/182 |
| 6,567,259 B2 * | 5/2003 | Stevenson et al. | 361/302 |
| 6,882,248 B2 * | 4/2005 | Stevenson et al. | 333/182 |
| 6,898,066 B1 * | 5/2005 | Lin | 361/301.3 |
| 6,900,978 B2 | 5/2005 | Shimizu et al. | |
| 7,035,076 B1 * | 4/2006 | Stevenson | 361/302 |
| 7,038,900 B2 * | 5/2006 | Stevenson et al. | 361/302 |
| 7,145,076 B2 * | 12/2006 | Knappen et al. | 174/50.6 |
| 7,187,535 B1 * | 3/2007 | Iyer et al. | 361/302 |
| 7,295,086 B2 | 11/2007 | Van Hoyweghen, III et al. | |
| 7,511,938 B2 * | 3/2009 | Elam et al. | 361/302 |
| 7,561,405 B1 * | 7/2009 | Grupa et al. | 361/302 |

(Continued)

FOREIGN PATENT DOCUMENTS

EP 1738460 1/2007

(Continued)

*Primary Examiner* — Bradley Thomas
(74) *Attorney, Agent, or Firm* — Harness, Dickey & Pierce, P.L.C.

(57) ABSTRACT

A feedthrough capacitor assembly for attachment to a mount having an opening is disclosed. The assembly includes a feedthrough terminal adapted for insertion through said opening for coupling a signal from a first side of the mount to a second side of the mount. The assembly includes a first conductive region extending about and electrically coupled to the feedthrough terminal and a second conductive region extending about the first conductive region. A plurality of capacitors are electrically coupled between the first conductive region and the second conductive region. The plurality of capacitors are arranged about the feedthrough terminal with each capacitor having about the same capacitance as each of the other capacitors.

20 Claims, 19 Drawing Sheets

U.S. PATENT DOCUMENTS

| | | |
|---|---|---|
| 7,889,020 B2 * | 2/2011 | Hock et al. .................. 333/12 |
| 2004/0085158 A1 | 5/2004 | Van Hoyweghen, III et al. |
| 2004/0201947 A1 * | 10/2004 | Stevenson et al. ............ 361/302 |
| 2005/0219787 A1 * | 10/2005 | Stevenson et al. ............ 361/302 |
| 2005/0248907 A1 * | 11/2005 | Stevenson et al. ......... 361/306.2 |
| 2006/0028784 A1 * | 2/2006 | Brendel .................. 361/302 |
| 2006/0221543 A1 * | 10/2006 | Stevenson et al. ............ 361/302 |
| 2007/0019362 A1 * | 1/2007 | Stevenson et al. ............ 361/302 |
| 2007/0035910 A1 * | 2/2007 | Stevenson .................. 361/302 |
| 2007/0053137 A1 * | 3/2007 | Fu et al. .................. 361/302 |
| 2008/0033496 A1 * | 2/2008 | Iyer et al. .................. 607/5 |
| 2008/0247117 A1 * | 10/2008 | Elam et al. .................. 361/302 |
| 2009/0116167 A1 * | 5/2009 | Stevenson et al. ......... 361/306.1 |
| 2010/0202096 A1 * | 8/2010 | Iyer .................. 361/302 |
| 2010/0284124 A1 * | 11/2010 | Iyer .................. 361/302 |

FOREIGN PATENT DOCUMENTS

JP     2001-023849     1/2001

* cited by examiner

US 8,154,846 B2

FEEDTHROUGH CAPACITOR ASSEMBLIES

FIELD

The present disclosure relates to feedthrough capacitor assemblies.

BACKGROUND

This section provides background information related to the present disclosure which is not necessarily prior art.

Feedthrough capacitors are commonly used to filter unwanted signals from a signal line as it enters or leaves a chassis, compartment, equipment, etc. Hence, a feedthrough capacitor can provide noise isolation between two areas (e.g. inside/outside, compartment a/compartment b, etc.). One known type of feedthrough capacitor 10 is illustrated in FIG. 1. The feedthrough capacitor 10 is illustrated attached to, and passing through, a panel 12. The feedthrough capacitor 10 includes a feedthrough terminal 14 for carrying a signal from one side of the panel 12 to the other and a dielectric 16. The panel is typically conductive and grounded and the feedthrough capacitor 10 is electrically connected to ground through the panel. Thus, a capacitive connection is created between the feedthrough terminal 14 and ground.

SUMMARY

This section provides a general summary of the disclosure, and is not a comprehensive disclosure of its full scope or all of its features.

According to one example embodiment, a feedthrough capacitor assembly for attachment to a mount having an opening is disclosed. The assembly includes a feedthrough terminal adapted for insertion through said opening for coupling a signal from a first side of the mount to a second side of the mount. The assembly includes a first conductive region extending about and electrically coupled to the feedthrough terminal and a second conductive region extending about the first conductive region. A plurality of capacitors are electrically coupled between the first conductive region and the second conductive region. The plurality of capacitors are arranged about the feedthrough terminal with each capacitor having about the same capacitance as each of the other capacitors.

According to another embodiment, a feedthrough capacitor assembly for attachment to a mount having an opening is disclosed. The assembly includes a feedthrough terminal adapted for insertion through said opening for coupling a signal from a first side of the mount to a second side of the mount. The assembly also includes a circuit board having a first conductive region electrically coupled to the feedthrough terminal, a second conductive region extending about the first conductive region and a plurality of capacitors electrically coupled between the first conductive region and the second conductive region.

According to yet another embodiment, a feedthrough capacitor assembly for attachment to a mount having an opening is disclosed. The assembly includes a feedthrough terminal adapted for insertion through said opening for coupling a signal from a first side of the mount to a second side of the mount and a circuit board. The circuit board includes a first conductive region electrically coupled to the feedthrough terminal, a second conductive region extending about the first conductive region and a plurality of capacitors electrically coupled between the first conductive region and the second conductive region. The plurality of capacitors are arranged annularly about the feedthrough terminal with each capacitor having about the same capacitance as each of the other capacitors. The assembly also includes a support plate for attaching the assembly to the mount. The support plate is mechanically connected to the circuit board and electrically coupled to the second conductive region.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 20:
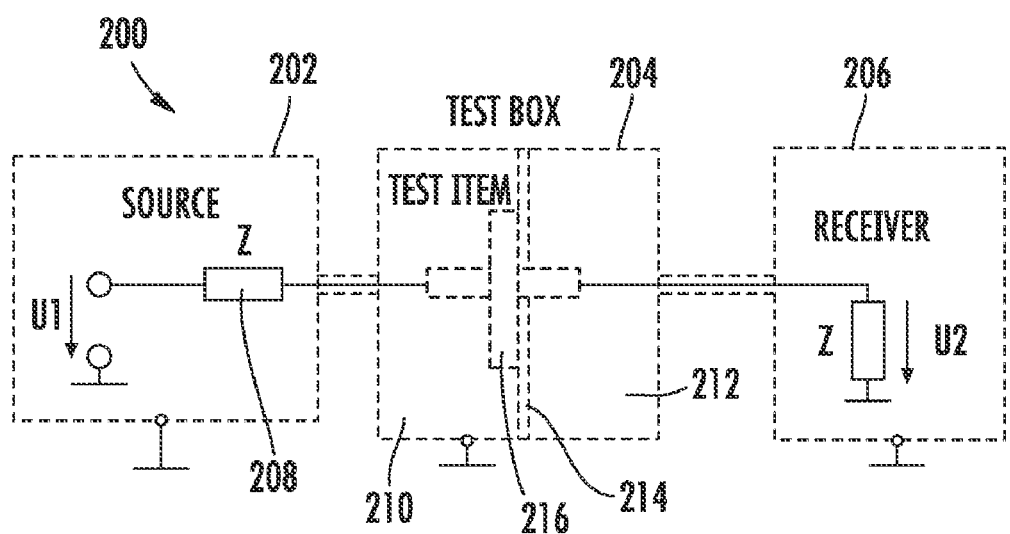

FIG. 20 diagram of a test setup for testing feed through capacitors.

Figure 21:
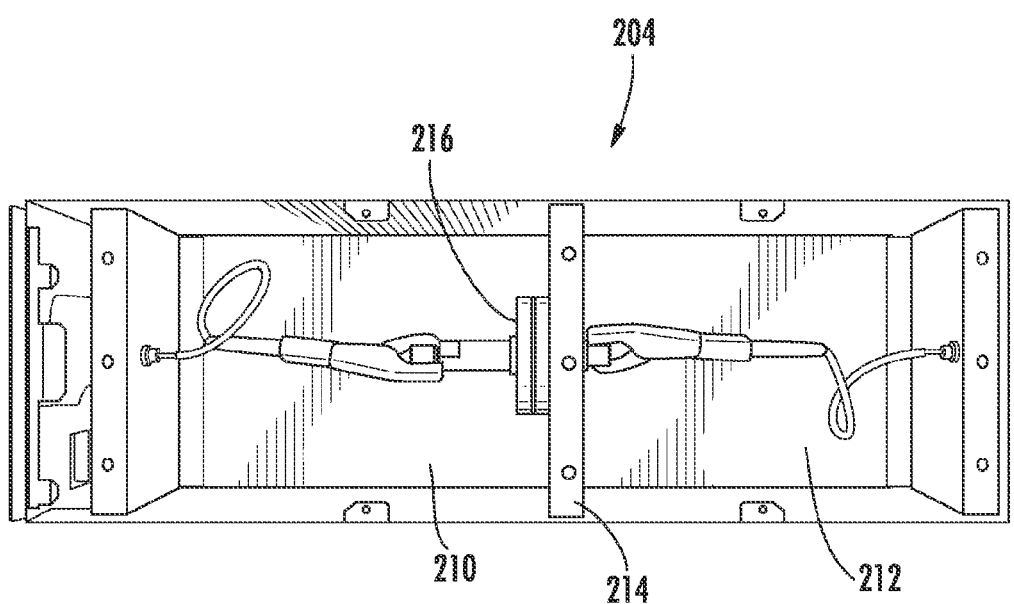

FIG. 21 is a test box for the test setup of FIG. 20.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to one aspect of the present disclosure, a feedthrough capacitor assembly includes a plurality of capacitors arranged about a feedthrough terminal. Each of the capacitors has about the same capacitance as each of the other capacitors.

According to another aspect of the present disclosure, a feedthrough capacitor assembly includes a circuit board having a plurality of capacitors electrically coupled between a first conductive region and a second conductive region on the circuit board. A feedthrough terminal is electrically coupled to the first conductive region.

An example of a feedthrough capacitor assembly according to one or more of the aforementioned aspects will be described with reference to FIGS. 2-10. Various views of the assembled assembly can be seen in FIGS. 2-5 and 10. An assembly is illustrated in exploded view in FIG. 6 and the components of a disassembled assembly are shown in FIGS. 7A-7E and 8. An example feedthrough capacitor assembly is illustrated attached to a mount in FIG. 9.

An example feedthrough capacitor assembly is generally indicated by reference numeral 100 in FIGS. 2-9. The assembly 100 includes a feedthrough terminal 102 adapted for insertion through an opening in a mount 104 for coupling a signal from a first side of the mount to a second side of the mount 104. The assembly 100 includes a first conductive region 106 extending about and electrically coupled to the feedthrough terminal 102 and a second conductive region 108 extending about the first conductive region 106. A plurality of capacitors 110 are electrically coupled between the first conductive region 106 and the second conductive region 108. The plurality of capacitors 110 are arranged about the feedthrough terminal 102 with each capacitor 110 having about the same capacitance as each of the other capacitors 110. The capacitors 110 are illustrated as surface mount chip capacitors, but may be any type of capacitor including through-hole, ceramic, foil, etc.

According to some embodiments the feedthrough capacitor assembly 100 includes a circuit board 112. The first conductive region 106 and the second conductive region 108 are disposed on the circuit board 112. In some embodiments, the circuit board 112 is a printed circuit board and the first and second conductive regions 106, 108 are traces on the circuit board 112. As can be seen most clearly in FIG. 8, there is a nonconductive region 114 between the first and second conductive regions 106, 108. The plurality of capacitors 110 are electrically coupled between the first and second conductive regions 106, 108 and span the nonconductive region 114. In some embodiments, the plurality of capacitors 110 are annularly arranged. Other arrangement, however, (e.g., square, hexagonal, oval, etc.) may also be used. Similarly, although the circuit board 112 is illustrated as having a square shape, other shaped circuit board may also be used.

Figure 1:
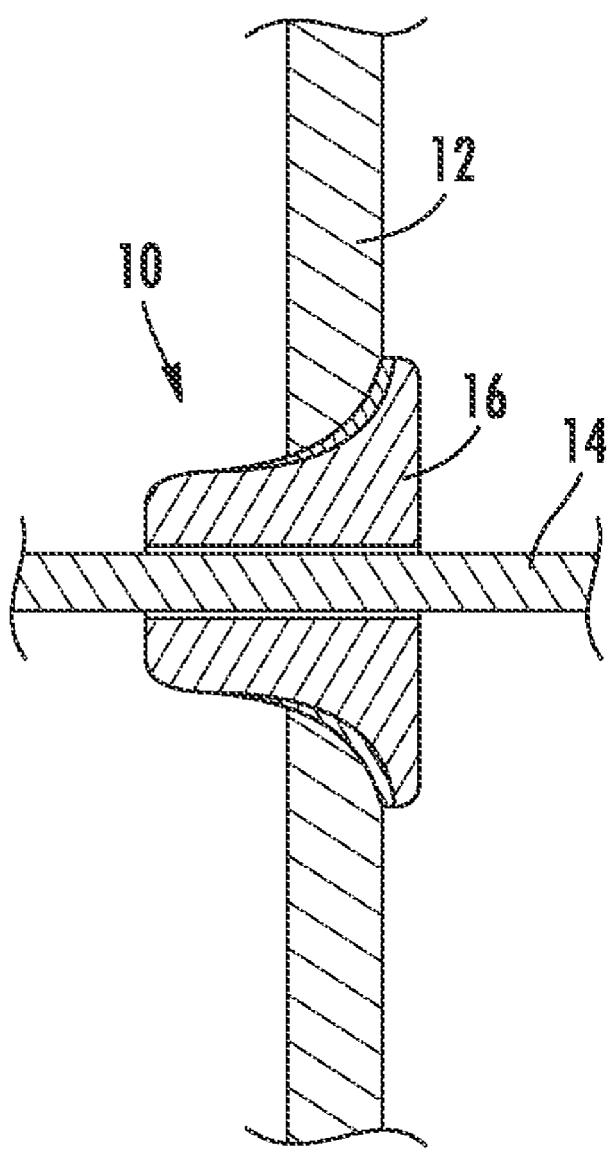
FIG. 1 is a prior art feedthrough capacitor.
Figure 2:
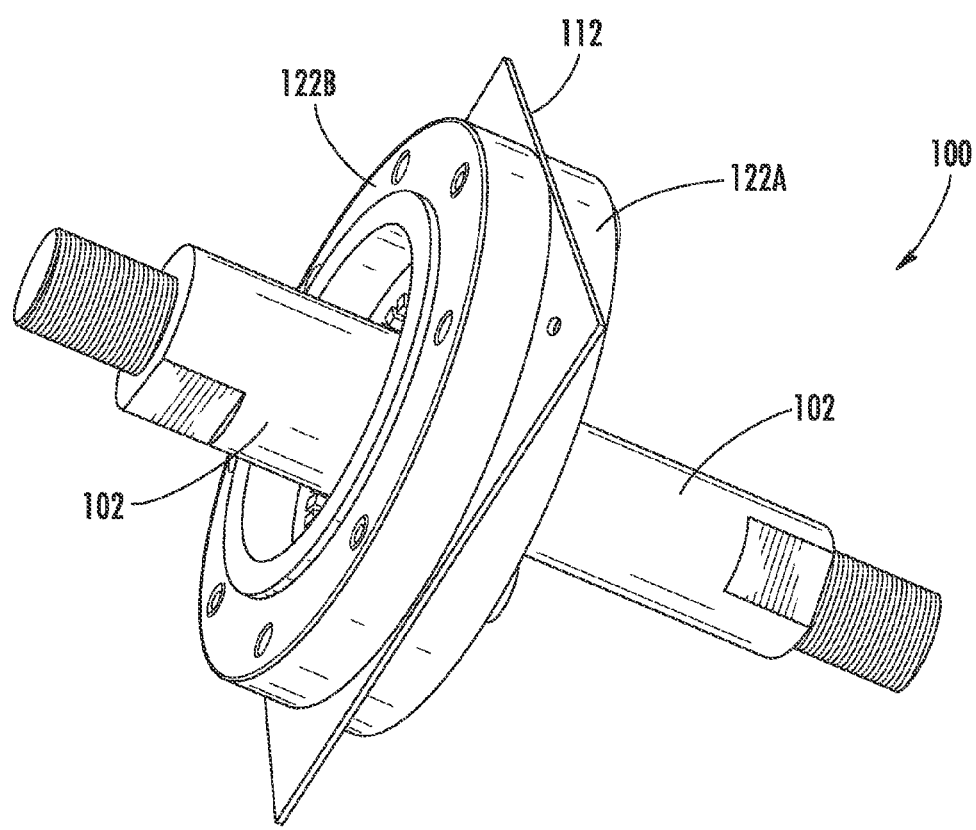
FIG. 2 is an isometric view of a feedthrough capacitor assembly of the present disclosure.
Figure 3:
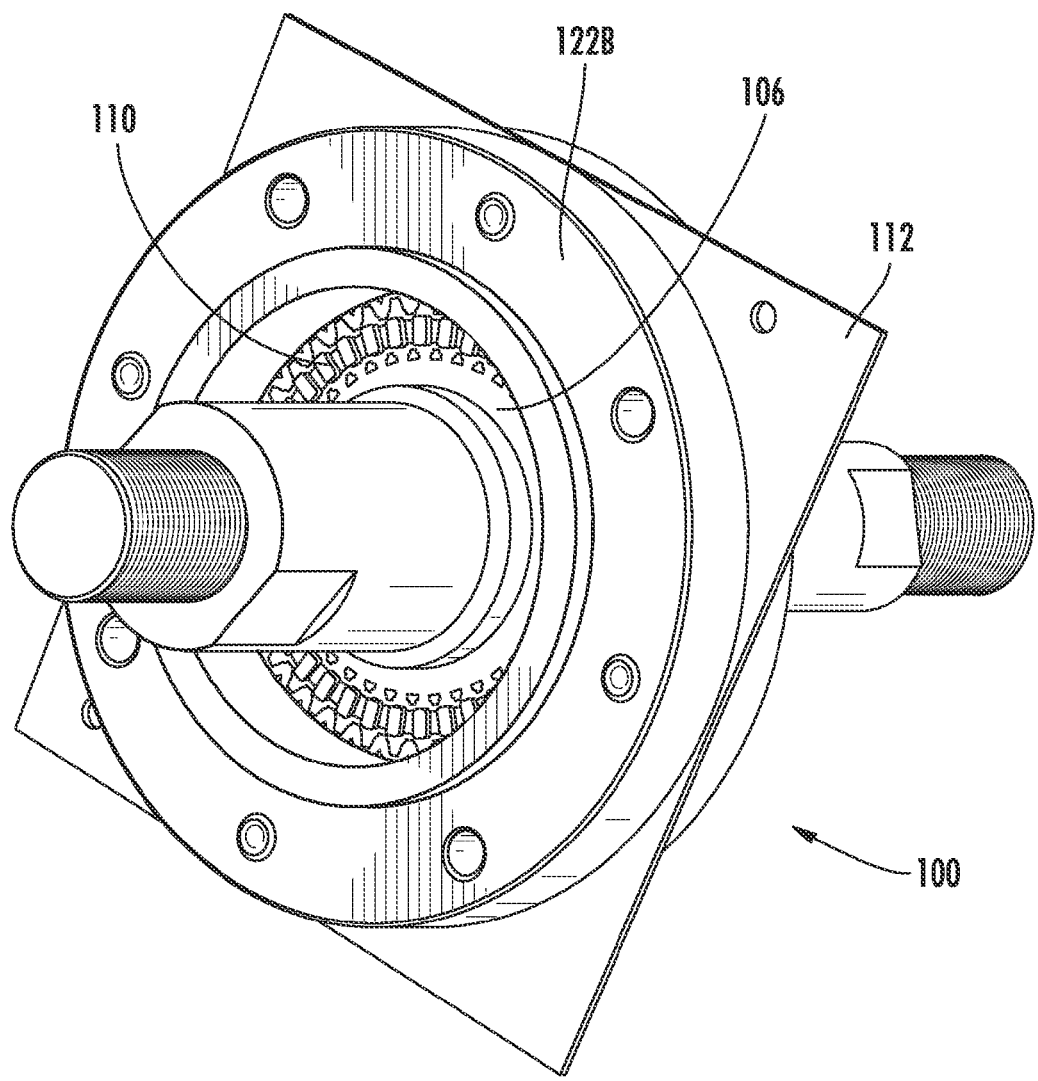
FIG. 3 is a front isometric view of the assembly in FIG. 2.
Figure 4:
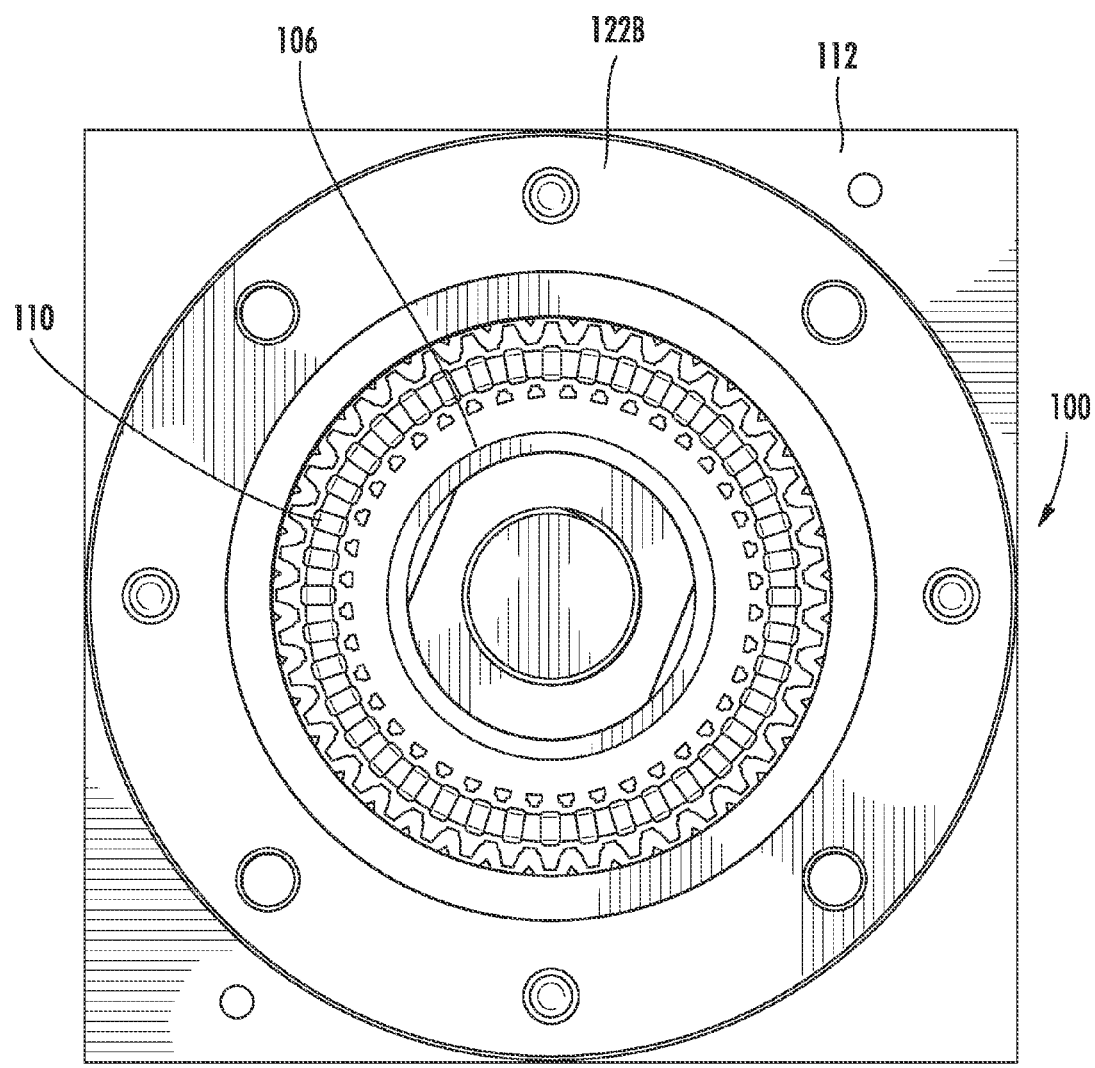
FIG. 4 is a front view of the assembly in FIG. 2.
Figure 5:
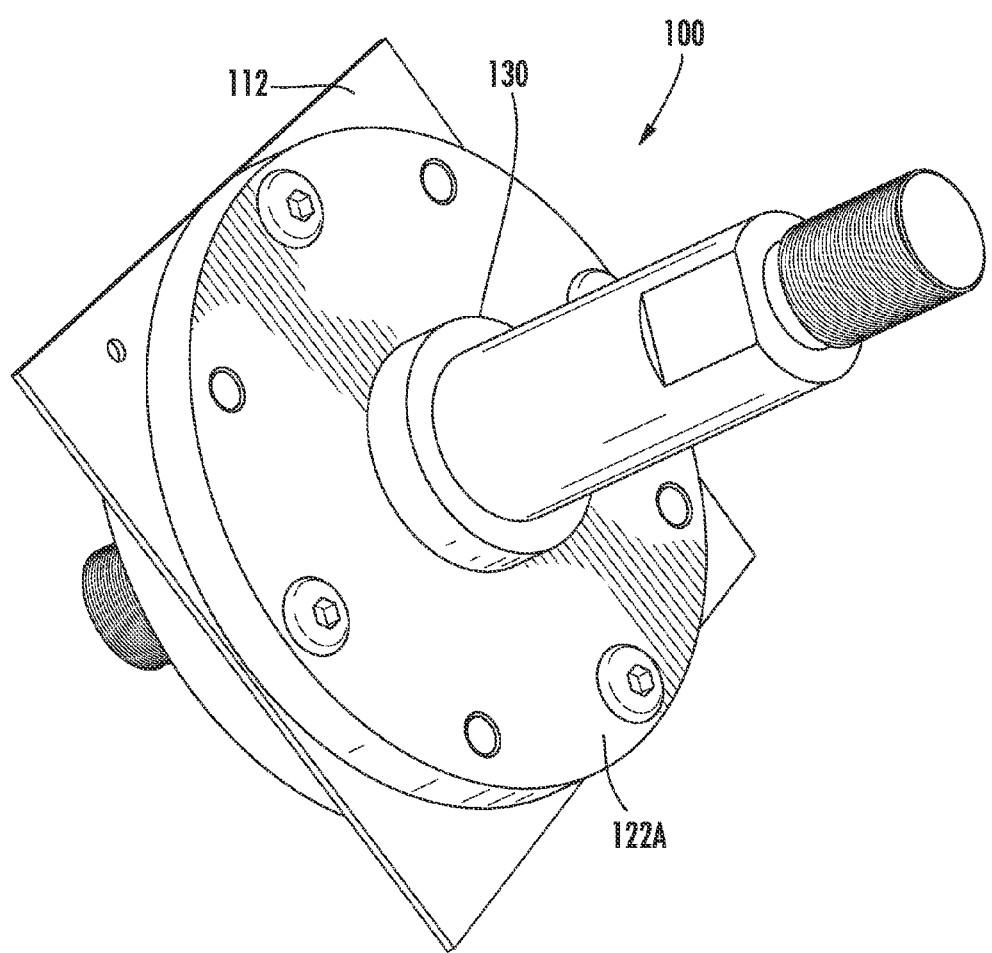
FIG. 5 is a rear isometric view of the assembly in FIG. 2.
Figure 6:
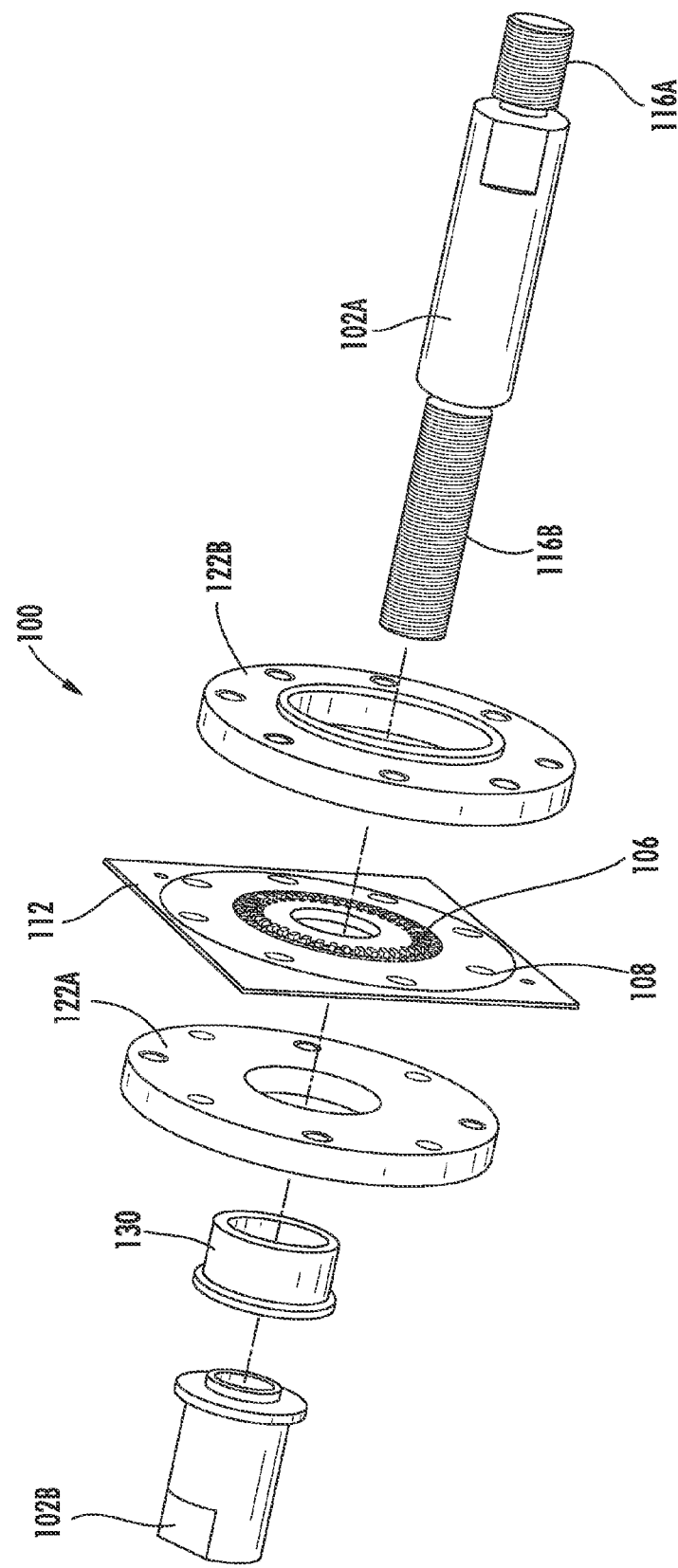
FIG. 6 is an exploded view of the of the assembly in FIG. 2.
Figure 7A:
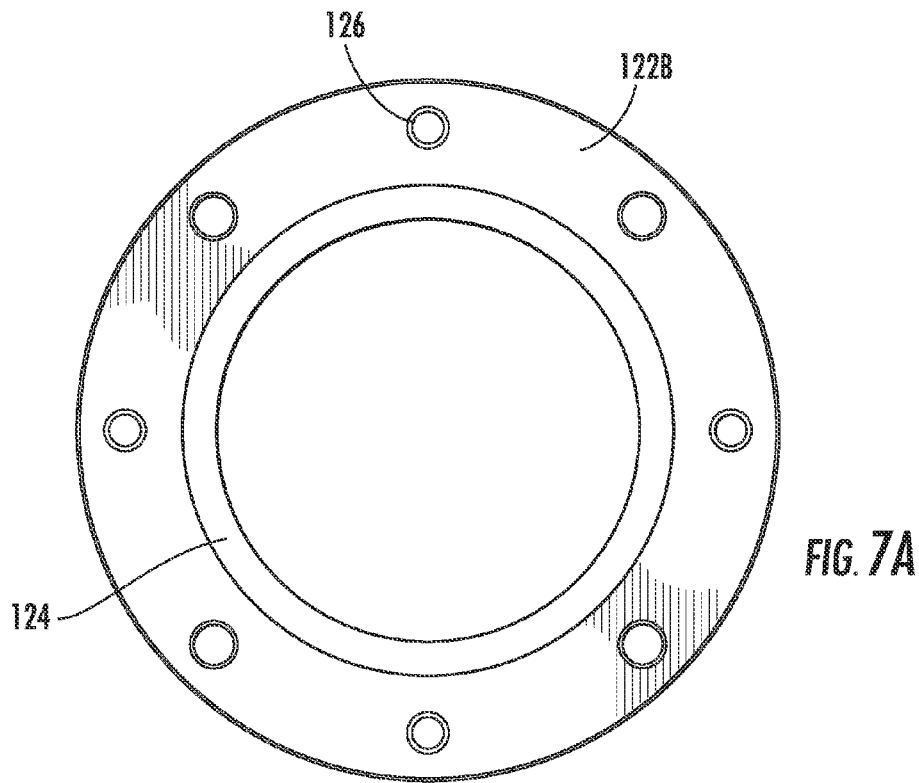
FIG. 7A is an illustration of a support plate of the assembly in FIG. 2 including a mounting flange.
Figure 7B:
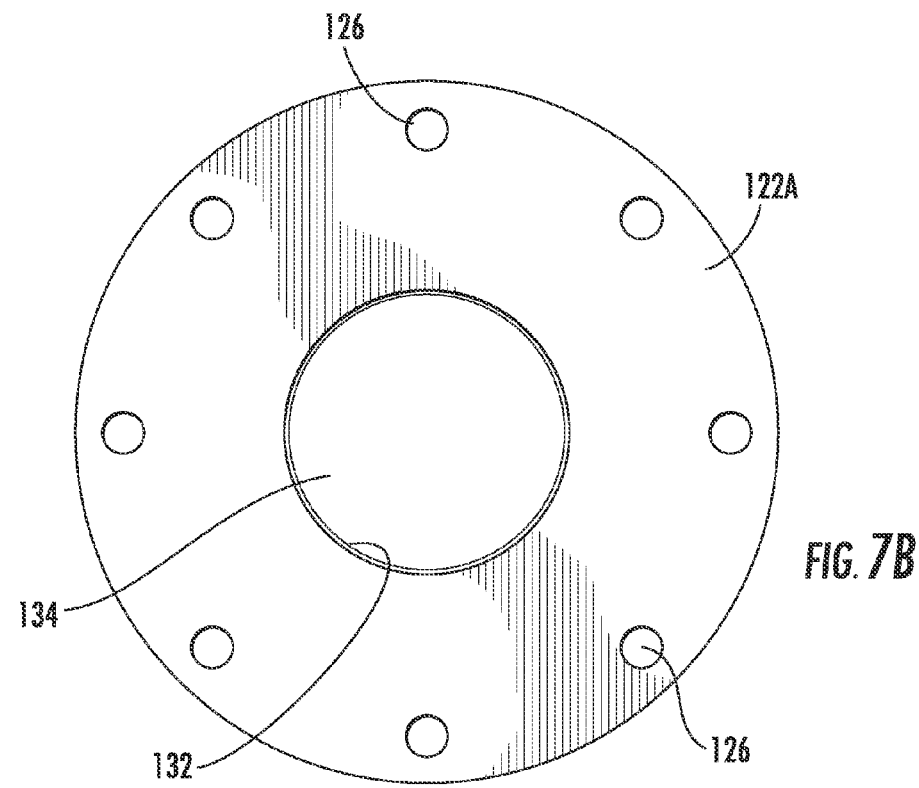
FIG. 7B is an illustration of another support plate of the assembly in FIG. 2.
Figure 7C:
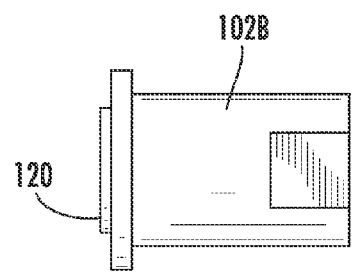
FIG. 7C is an illustration of a terminal portion of the assembly in FIG. 2.
Figure 7D:
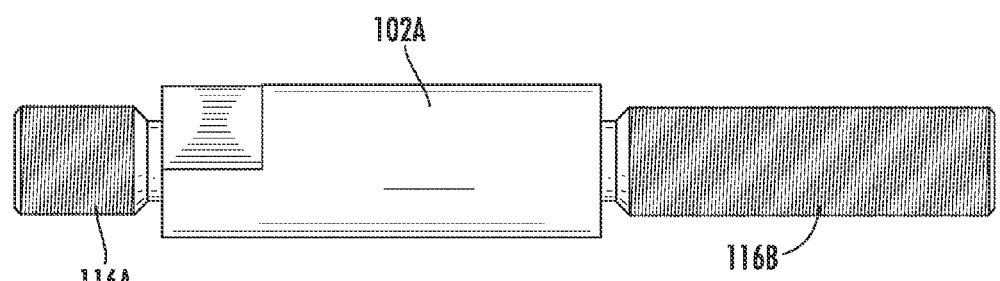
FIG. 7D is an illustration of another terminal portion of the assembly in FIG. 2.
Figure 7E:
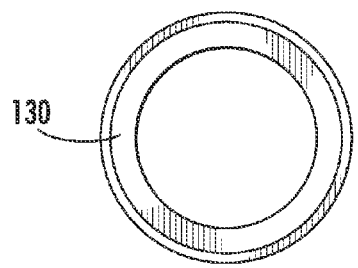
FIG. 7E is an illustration of an insulator of the assembly in FIG. 2.
Figure 8:
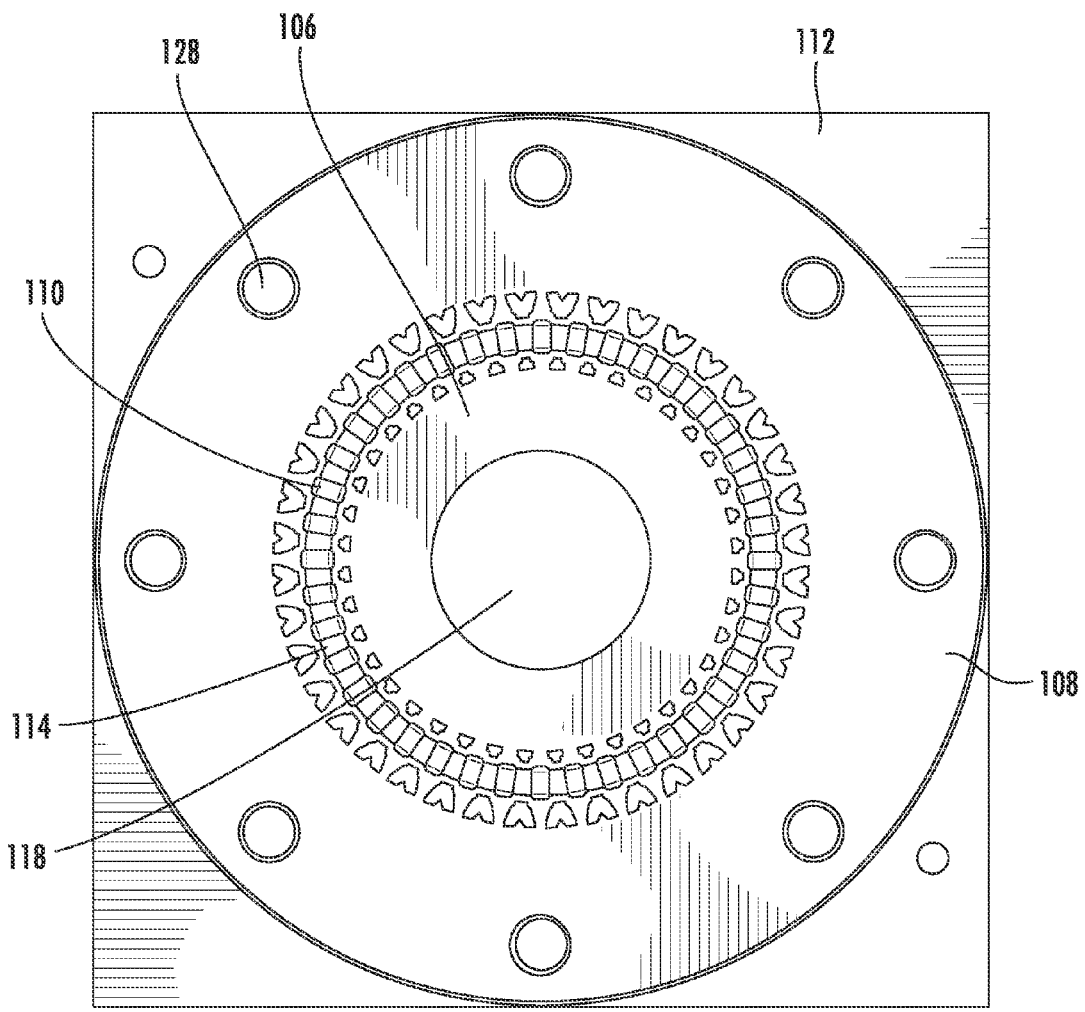
FIG. 8 is a circuit board of the assembly in FIG. 2 including a plurality of capacitors mounted thereon.

The feedthrough terminal 102 may be a two-piece feedthrough terminal 102 including a first terminal portion 102A and a second terminal portion 102B. The first terminal portion 102A includes threaded portions 116A and 116B. When assembled, as seen in FIG. 6, threaded portion 116B extends through a feedthrough opening 118 in the circuit board 112. Second terminal portion 102B, which is internally threaded, connects to the first terminal portion 102A on the threaded portion 116B. The second terminal portion 102B includes a contact face 120. When the feedthrough capacitor assembly 100 is assembled, the contact face 120 contacts, and electrically couples the terminal 102 with, the first conductive region 106. The feedthrough terminal is not limited to a two-piece design and may be a single-piece feedthrough terminal, have more than two pieces, etc.

A pair of support plates 122A and 122B (collectively 122) are positioned on opposing sides of the circuit board 112. The support plates 122 include several through holes 126 and are mechanically connected to each other (e.g. by screws, rivets, bolts, etc.) through the circuit board 112. Some of the through holes 126 are used for connecting the support plates 122 to each other and the circuit board 112. Other of the through holes are used for mounting the feedthrough capacitor assembly 100 to the mount 104. In the illustrated feedthrough capacitor assembly 100, there are eight through holes. Four of the through holes are used for connection between the support plates 122 and the remaining four are used for mounting the feedthrough capacitor assembly 100 to the mount 104. The support plates 122 have numerous other purposes and benefits. For example, the support plates 122 strengthen and reinforce the circuit board 112. This helps limit bending and flexing of the circuit board 112, which could damage the circuit board 112, the capacitors 110 or the connection of the capacitors 110 to the conductive traces 108, 106. Further, the support plate 122B makes contact with, and electrically couples to, the second conductive region 108. When the feedthrough capacitor assembly 100 is mounted to a mount 104, the support plate 122B contacts, and electrically couples to, the mount 104. As the mount 104 is typically grounded, the second conductive region 108 is, thus, coupled to ground through the support plate 122B. Additionally, the support plate 122B includes a flange 124 about the same shape and size as the opening in the mount 104 to aid alignment with the opening in the mount 104. Alternatively, or additionally, the feed through capacitor assembly 100 may include more or fewer (including none) support plates 122.

When assembled, the feedthrough capacitor assembly 100 includes the circuit board 112, with the capacitors 110 mounted thereon, sandwiched between the support plates 122. The two support plates 122 are mechanically connected through the circuit board 112 using screws, bolts, rivets, etc. through at least some of the through holes 126 and some of a plurality of through holes 128 on the circuit board 112. An insulator 130 is captured by a rabbit 132 within a central opening 134 of support plate 122A. The feedthrough terminal 102 passes through the central opening 134, feedthrough opening 118, and a central opening 138 in the support plate 122B. The feedthrough terminal 102 is electrically coupled to the first conductive region 106 and the support plate 122B is electrically coupled to the second conductive region 108.

Figure 9:
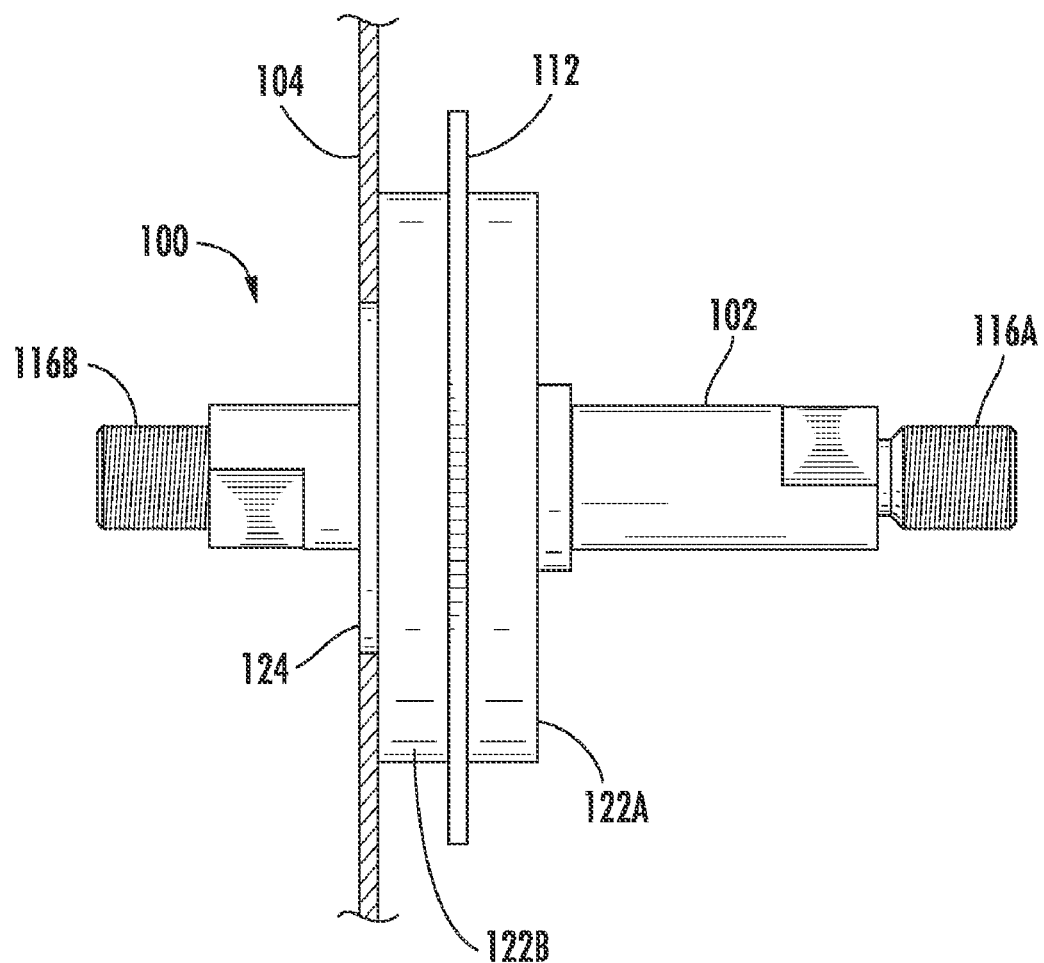
FIG. 9 is a side view of the assembly in FIG. 2 mounted on a mount having a hole therein.
Figure 10:
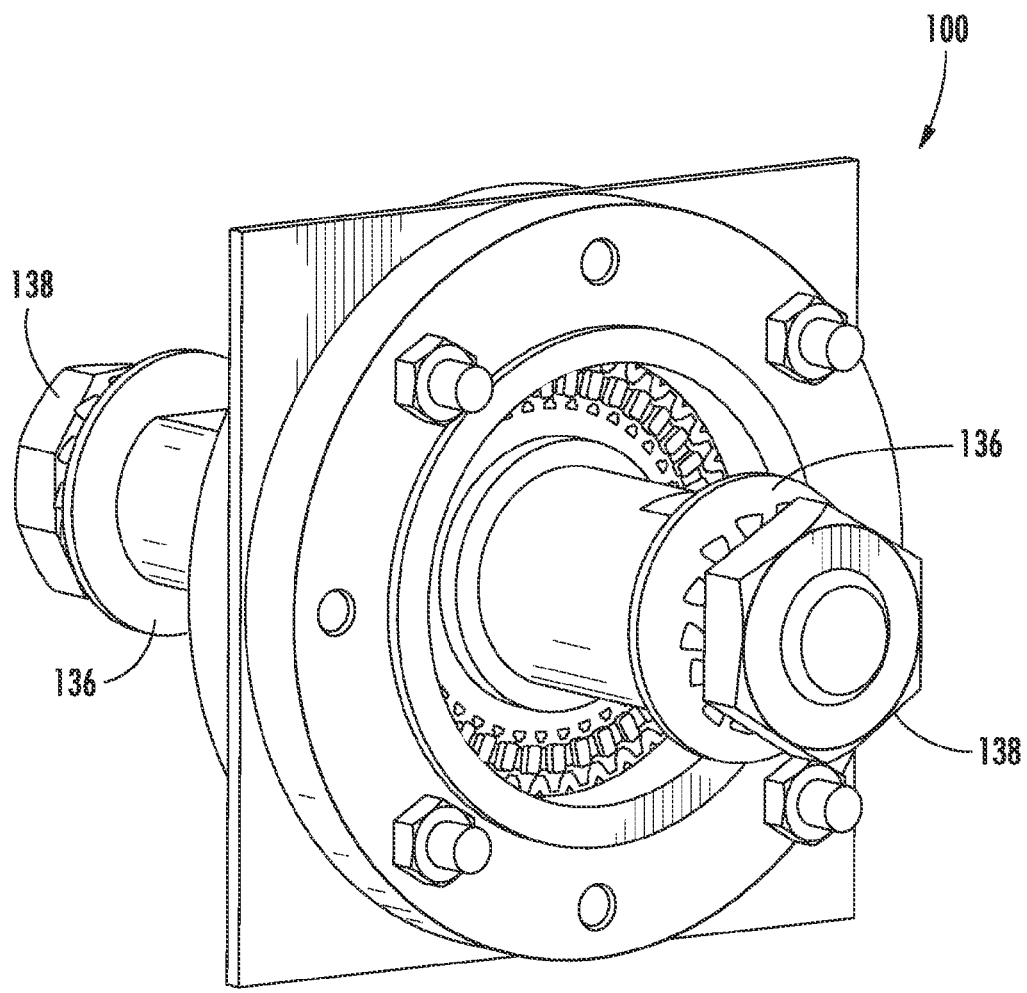
FIG. 10 is another front isometric view of the assembly in FIG. 2.

The assembled feedthrough capacitor assembly 100 can then be mounted to a mount 104 as shown in FIG. 9. As discussed above, bolts, screws, rivets, etc. may be used to mount the feedthrough capacitor assembly 100 to the mount 104 through the support plates 122. As shown in FIG. 10, washers 136 and nuts 138 may be mounted on each threaded portion 116A, 116B. A conductor (not shown) may be terminated on each feedthrough terminal 102 by capturing the conductor (or a connector attached thereto) between the washers 136 and the nuts 138.

As mentioned above, each of the capacitors 110 of the feedthrough capacitor assembly 100 has about the same capacitance as each of the other capacitors 110. Thus, for example, in FIG. 9 it can be that the feedthrough capacitor assembly 100 includes forty capacitors 110, each having a nominal capacitance of one hundred nanofarads (100 nF). Because the capacitors 110 are connected in parallel, the plurality of capacitors 110 has an equivalent capacitance equal to the sum of the capacitance of each individual capacitor. Thus, in the example feedthrough capacitor assembly 100, the forty 100 nF capacitors 110 have an equivalent capacitance of four microfarads (4 uF). In addition to a capacitance, real capacitors also have an inductive and resistive component, the equivalent series inductance (ESL) and the equivalent series resistance (ESR). The ESL and ESR of a capacitor causes a capacitor to behave differently than an ideal, i.e. capacitance only, capacitor. For example, the ELS and/or ESR can change the frequency response of a capacitor and cause resonances at certain frequencies. When capacitors are connected in parallel, however, the equivalent, or total, ELS and ELR decrease approximately proportional to the number of capacitors connected in parallel. Thus, when forty capacitors are connected in parallel, the result is a total ESL and ESR of about 1/40 that of each individual capacitor.

The nominal value of the capacitors 110 and the number of capacitors 110 used in the feedthrough capacitor assembly 100 may vary depending on the desired results and design constraints for a particular project. The desired equivalent capacitance may be determined according to methods known to those skilled in the art in order to get a desired frequency response. For a desired equivalent capacitance, there are numerous, if not infinite, combinations of capacitors 110 that may be connected in parallel to achieve the desired equivalent capacitance. For example, a 4 uF equivalent capacitance may be achieved with four 1 uF capacitors, forty 100 nF capacitors or four hundred 10 nF capacitors. The number of capacitors 110 may be limited by size and cost constraints. Thus, while using four hundred 10 nF capacitors may result in the smallest total ESL and ESR (of these three examples), assembly size constraints, and likely price, will often make such a number unrealistic. Conversely, although using four 1 uF capacitors may be cheaper and may allow for a smaller assembly 100, the total ESL and ESR may be higher than desired. Because the total ESL and ESR decrease proportional to the increase in number of capacitors 110 and because a low ESL and ESR is desired in a feedthrough capacitor, more capacitors 110 is generally preferred in the feedthrough capacitor assembly 100. As explained above, however, the exact number and capacitance value is a design choice and will often involve balancing various size and cost restraints with performance characteristics and reduced ESL and ESR.

An example of one way of selecting capacitors 110 for the feedthrough capacitor assembly 100 will now be described. Assume the desired damping factor of the feedthrough capacitor assembly 100 is 35 dB attenuation from 0.1-1 MHz, 35 dB-20 dB attenuation from 1-3 MHz and 20 dB from 3-30 MHz in a 50 ohm measurement system. The damping factor (35 dB) for the lowest frequency range (0.1-1 MHz) is selected. The minimum capacitance value which will result in a 35 dB damping factor at 0.1 Mhz is calculated. In this example, the result is about 4 μF. The damping factor (20 dB) for the highest frequency (30 MHz) of the highest range is next selected. The maximum impedance of the feedthrough capacitor assembly 100 that will permit the feedthrough capacitor assembly 100 to achieve this result is then calculated. A number of capacitors 110 for the feedthrough capacitor assembly 100 may be determined by calculating the ESL of combinations of paralleled capacitors that total the desired total capacitance (4 uF in this example). The ESL of the parallel combination of capacitors 110 should be less than the previously calculated maximum impedance at the highest frequency. The process may be an iterative process, finding the ESL of two 2 uF capacitor, determining if it is less than the maximum impedance, trying four 1 uF capacitors, then forty 100 nF capacitors, etc. The process may also be done by an extremum problem calculation or using any other suitable method.

Equivalent circuits and results for several test feedthrough capacitor assemblies are illustrated in FIGS. 11-19. FIGS. 20 and 21 illustrate a test setup for use in measuring feedthrough capacitors As seen in FIGS. 20 and 21, a test setup 200 for testing feed through capacitors may include a source 202, a test box 204 and a receiver 206. The source includes a source impedance 208. The test box 204 includes high frequency sealed areas 210 and 212 and a high frequency sealed separation wall 214. A feedthrough capacitor 216 is mounted to the separation wall 214. The source 202 is coupled to the receiver 206 through the feedthrough capacitor 216. The damping factor of the capacitor is calculated by damping factor (in dB)=20*log (U1/(2*U2)).

Figure 11:
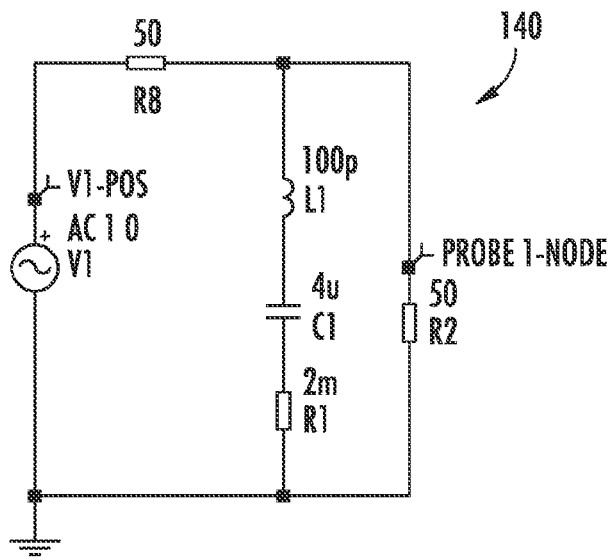
FIG. 11 is an equivalent test circuit for testing the damping performance of the assembly in FIG. 2 using capacitors all of which have the same capacitance.

An equivalent circuit 140 for the feedthrough capacitor assembly 100 using capacitors 110 that each have the same capacitance is illustrated in FIG. 11. The equivalent circuit represents a feedthrough capacitor assembly 100 with forty 100 nF ceramic capacitors of case size 0805. The equivalent circuit includes a 4 uF capacitor C1 in series with a 100 pH inductor L1 and a 2 mΩ resistor R1. A 50Ω resistor R2 represents a load. Resistor R8 represents the source impedance of source V1 and is part of the measurement system. The circuit is simulated using a variable frequency AC source V1. The damping performance of the test circuit 140, illustrated as a damping curve 141, over a frequency range from 10 kHz to 1 GHz is illustrated in FIG. 12.

Figure 13:
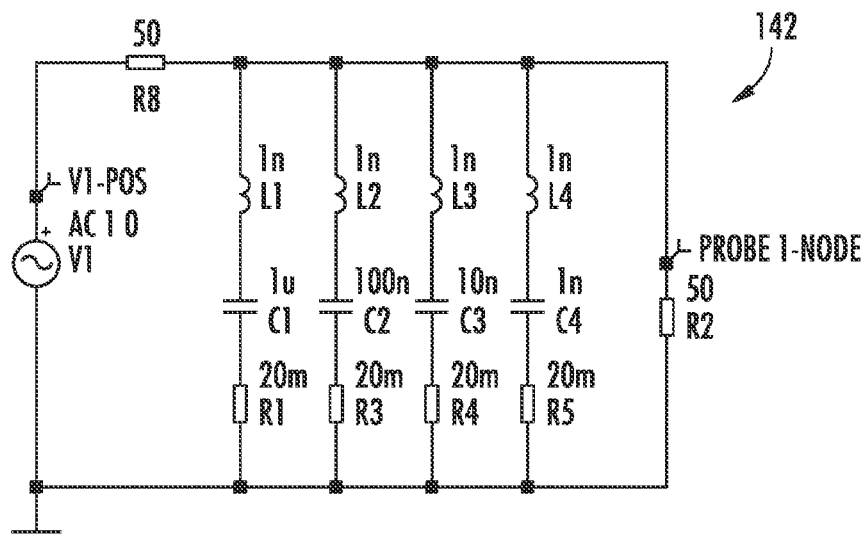
FIG. 13 is an equivalent test circuit for testing the damping performance of a feedthrough capacitor assembly using forty capacitors having four different capacitances.

In contrast, an equivalent circuit 142 for a feedthrough capacitor assembly using capacitors of different values is illustrated in FIG. 13. The equivalent circuit represents a feedthrough capacitor assembly with ten 100 nF, ten 10 nF, ten 1 nF, and ten 100 pF ceramic capacitors of case size 0805. The equivalent circuit includes a four capacitor C1-C4 each representing one of the groups of ten capacitors of a single capacitance. Each capacitor C1-C4 also includes and ESL and ESR. Again, a 50Ω resistor R2 represents a load and the circuit is simulated using a variable frequency AC source V1. Resistor R8 represents the source impedance of source V1 and is part of the measurement system. The damping performance of the test circuit 142, illustrated as a damping curve 143, over a frequency range from 10 kHz to 1 GHz is illustrated in FIG. 14.

Figure 15:
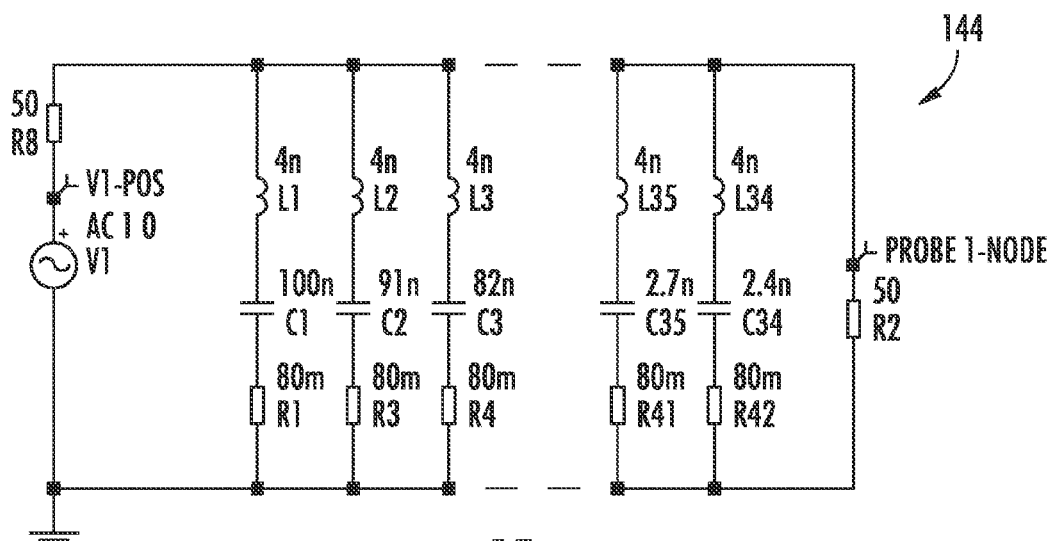
FIG. 15 is an equivalent test circuit for testing the damping performance of a feedthrough capacitor assembly using forty capacitors each of which has a different capacitance.

Another example equivalent circuit 144 for a feedthrough capacitor assembly using capacitors of different values is illustrated in FIG. 15. The equivalent circuit represents a feedthrough capacitor assembly with forty capacitors, each with a different capacitance. The capacitors step from 100 nF in E24 steps to 2.4 nF. All capacitors are ceramic capacitors of case size 0805. Again, a 50Ω resistor R2 represents a load and the circuit is simulated using a variable frequency AC source V1. Resistor R8 represents the source impedance of source V1 and is part of the measurement system. The damping performance of the test circuit 142, illustrated as a damping curve 145, over a frequency range from 10 kHz to 1 GHz is illustrated in FIG. 16.

Figure 12:
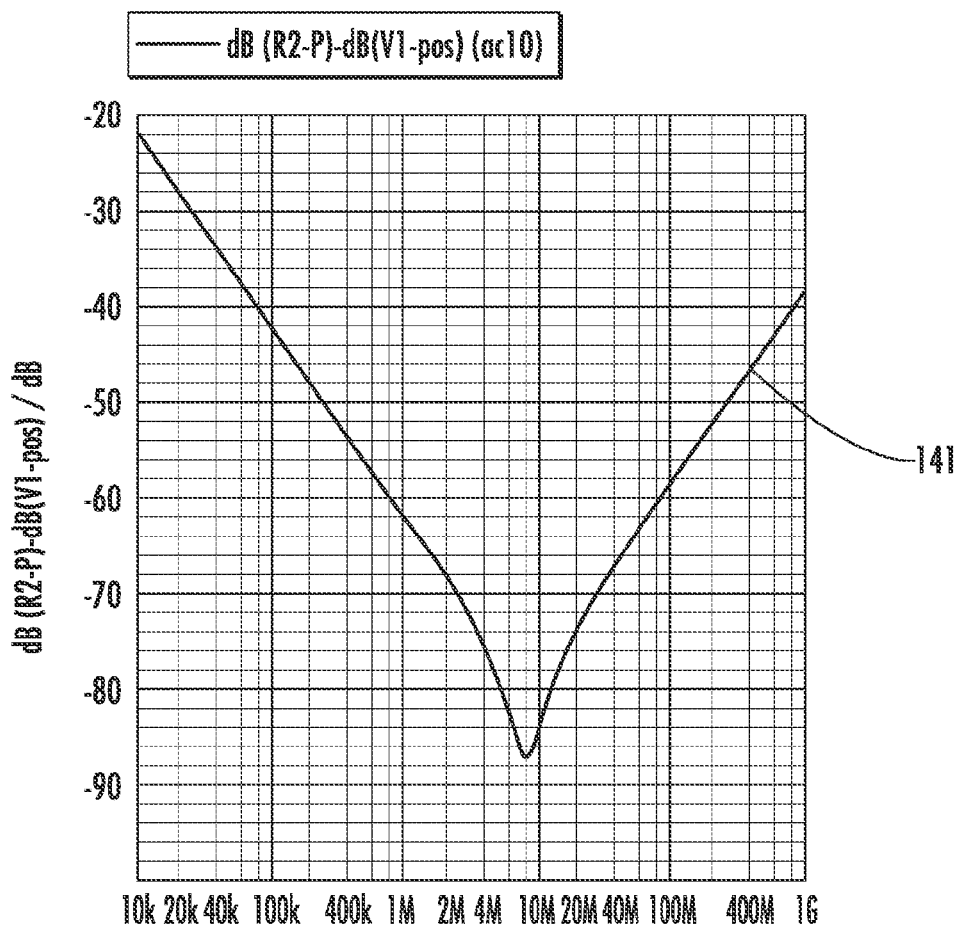
FIG. 12 is a graph of the damping performance of the circuit in FIG. 11.
Figure 14:
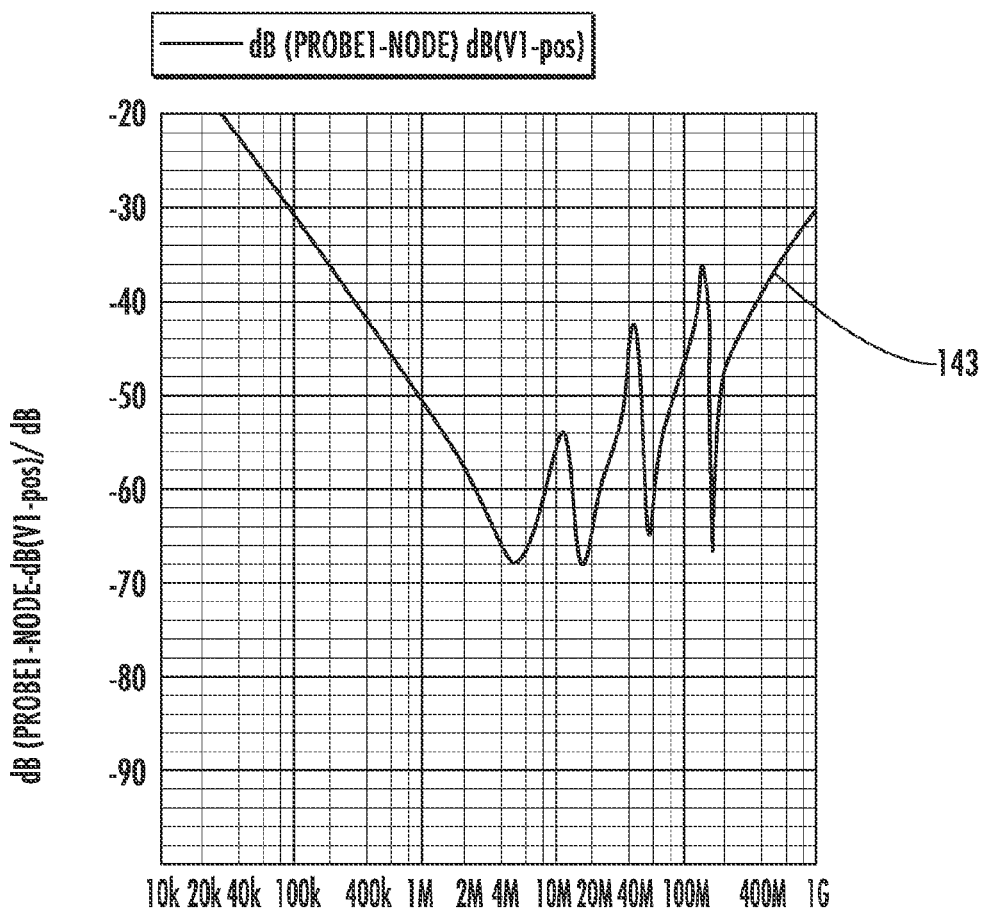
FIG. 14 is a graph of the damping performance of the circuit in FIG. 13.
Figure 16:
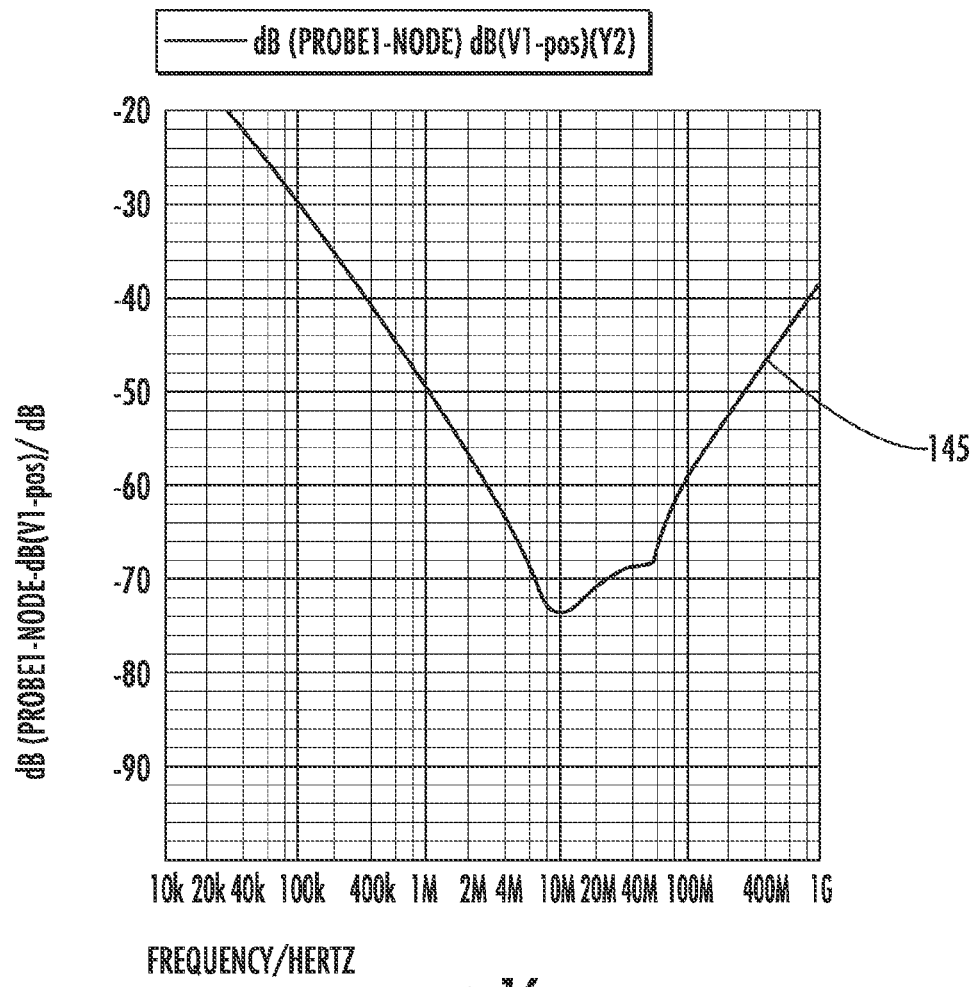
FIG. 16 is a graph of the damping performance of the circuit in FIG. 15.
Figure 17:
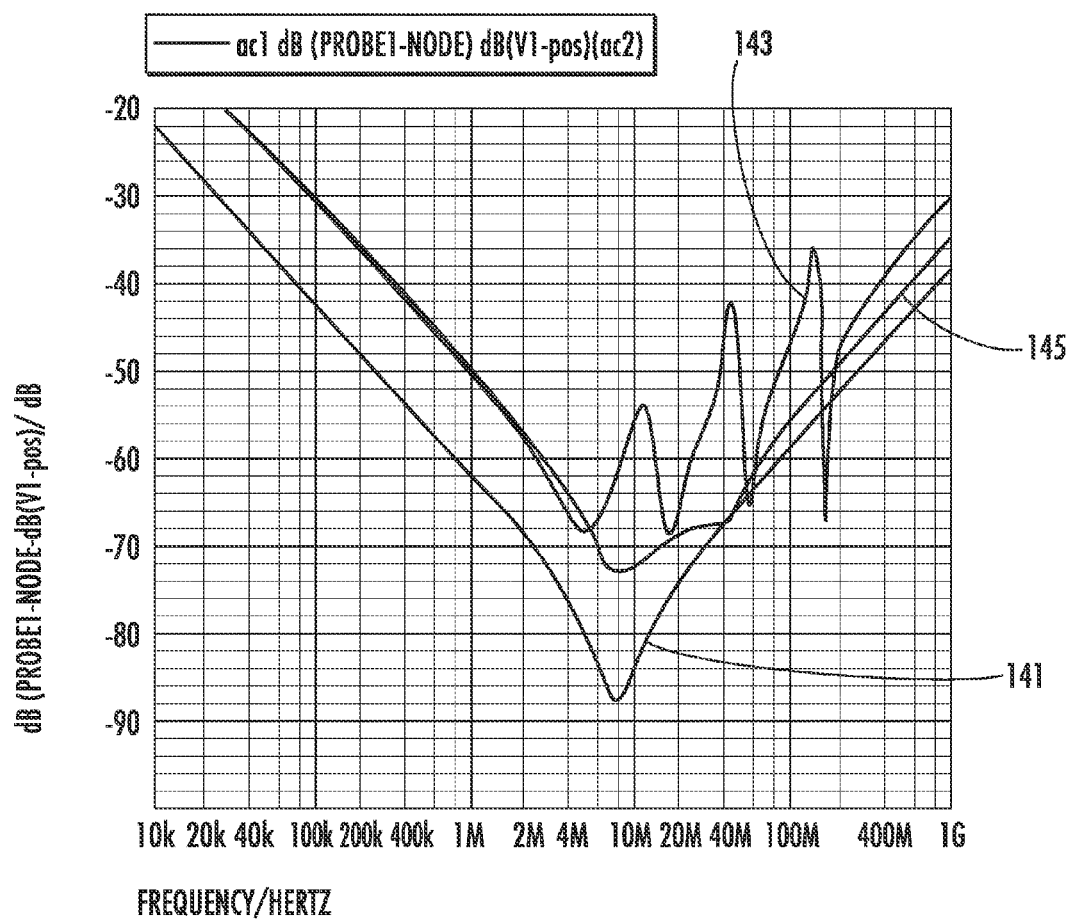
FIG. 17 is a graph superimposing the damping performances of each of the circuits in FIGS. 11, 13, and 15.

In FIG. 17, the damping results shown in FIGS. 12, 14 and 16 are superimposed on a single graph. As can be seen, damping curve 141, representing performance of the feedthrough capacitor assembly 100 having capacitors 110 all of the same capacitance, generally has greater damping and less ringing than either of damping curves 143 or 145.

Figure 18:
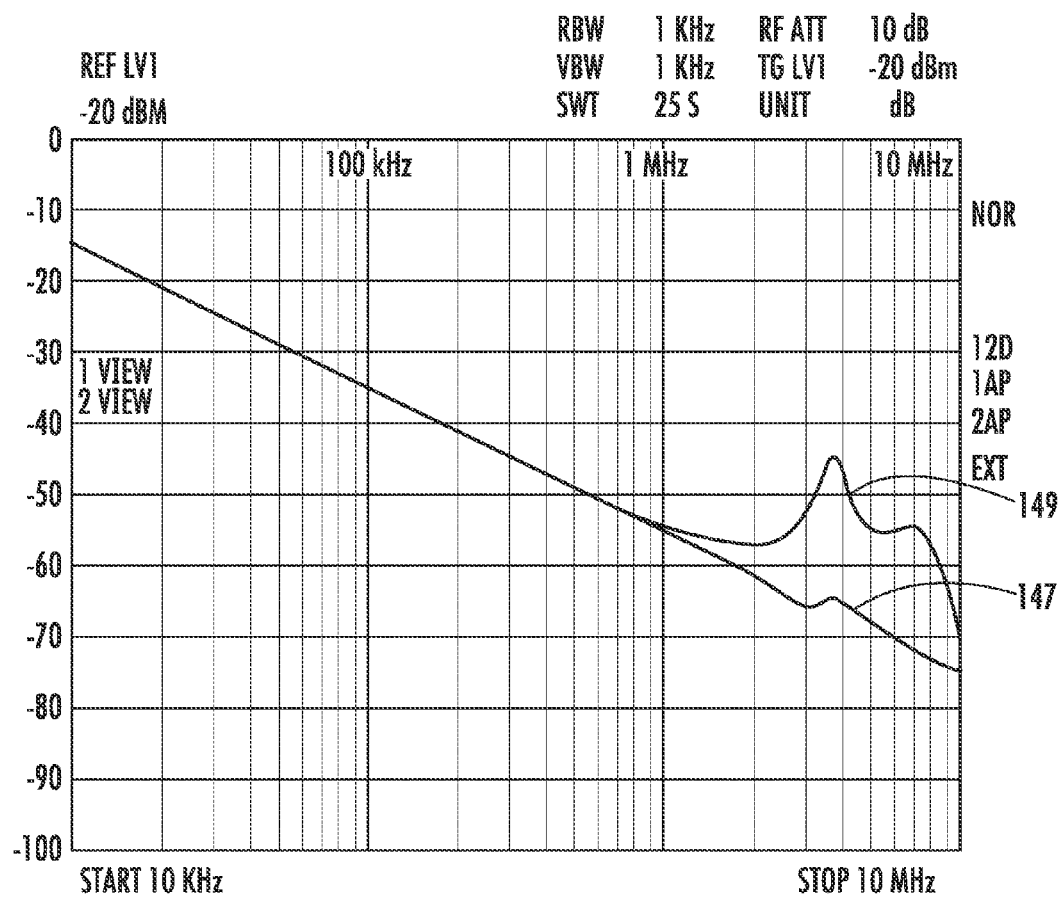
FIG. 18 is a graph of damping results for the feedthrough capacitor assembly of FIG. 2 using capacitors that each have the same capacitance and damping results for a standard foil-type feedthrough capacitor from 10 kHz to 10 MHz.
Figure 19:
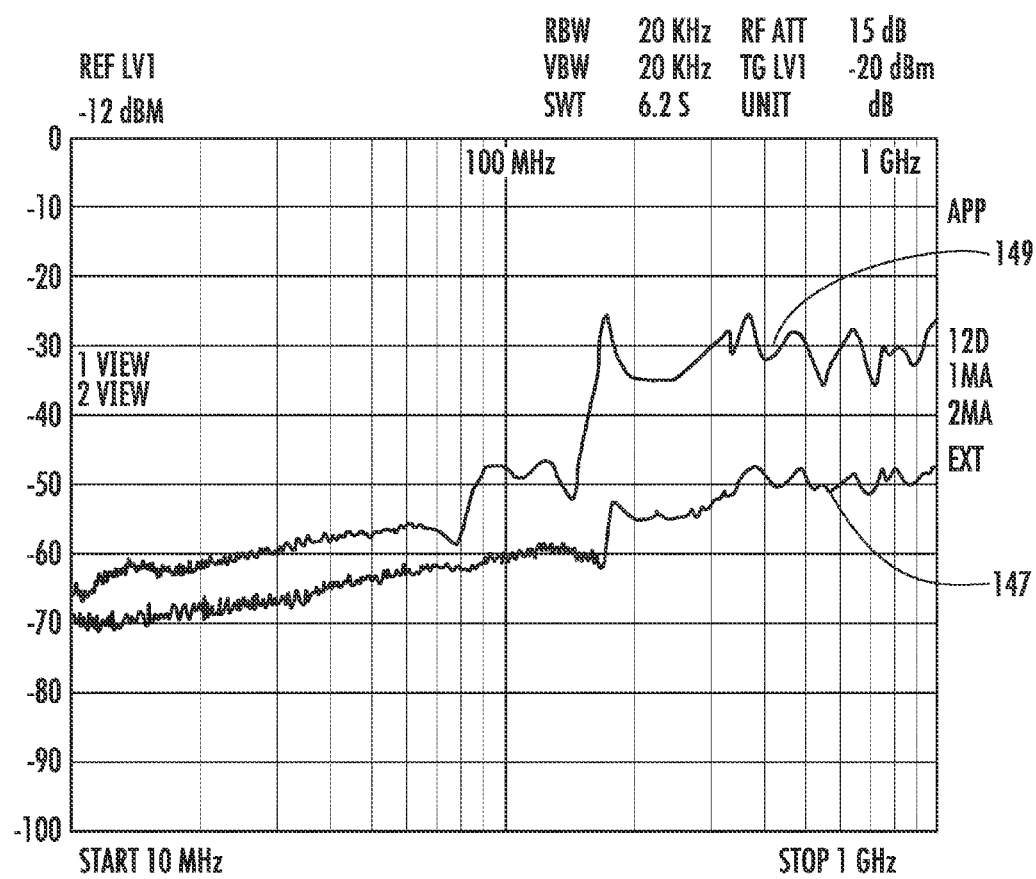
FIG. 19 is a graph of damping results for the feedthrough capacitor assembly of FIG. 2 using capacitors that each have the same capacitance and damping results for a standard foil-type feedthrough capacitor from 10 MHz to 1 GHz.

A damping results curve 147 for the feedthrough capacitor assembly 100 using capacitors 110 that each have the same capacitance is compared in FIGS. 18 and 19 with a damping results curve 149 for a standard foil-type feedthrough capacitor. A foil-type feedthrough capacitor acts as a standard capacitor in capacitance, ESR and ESL. A foil-type feedthrough capacitor may be large relative to a feedthrough capacitor assembly according to the present disclosure. FIG. 18 illustrates the results from 10 kHz to 10 MHz, while FIG. 19 illustrates the results from 10 MHz to 1 GHz. As can be seen, the feedthrough capacitor assembly 100 using capacitors 110 that each have the same capacitance generally exhibited increased damping and decreased ringing than the foil type feedthrough capacitor above about 1 MHz.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A feedthrough capacitor assembly for attachment to a mount having an opening, the assembly comprising:
    a feedthrough terminal adapted for insertion through said opening for coupling a signal from a first side of the mount to a second side of the mount;
    a first conductive region extending about and electrically coupled to the feedthrough terminal;
    a second conductive region extending about the first conductive region;
    a plurality of capacitors electrically coupled between the first conductive region and the second conductive region, the plurality of capacitors arranged about the feedthrough terminal; and
    a support plate having a central opening and opposite first and second sides, the feedthrough terminal extending through the central opening, the first side of the support plate adapted for contacting and electrically coupling to the mount around the mount opening, and the second side of the support plate contacting and electrically coupling to the second conductive region.

2. The assembly of claim 1 further comprising a nonconductive region positioned between the first conductive region and the second conductive region, the plurality of capacitors spanning the nonconductive region.

3. The assembly of claim 2 further comprising a circuit board having an opening, wherein the first and second conductive regions are disposed on the circuit board, the feedthrough terminal extends through the circuit board, and the plurality of capacitors are mounted to the circuit board.

4. The assembly of claim 3 wherein the plurality of capacitors are arranged annularly about the feedthrough terminal.

5. The assembly of claim 4 wherein the circuit board is a printed circuit board and the first conductive region and the second conductive region are traces on the printed circuit board.

6. The assembly of claim 5 wherein the support plate is a first support plate, the assembly further comprising a second support plate, the first support plate and the second support plate positioned on opposing sides of the circuit board, the first support plate mechanically connected to the second support plate.

7. The assembly of claim 6 wherein the assembly is attached to the mount with the feedthrough terminal extending through the opening and the second conductive region coupled to ground.

8. The assembly of claim 7 wherein the support plate includes a projecting flange for aligning the assembly with the opening in the mount.

9. The assembly of claim 7 wherein each capacitor has about the same capacitance as each of the other capacitors.

10. The assembly of claim 1 wherein the plurality of capacitors are arranged annularly about the feedthrough terminal.

11. The assembly of claim 10 further comprising a circuit board having an opening, wherein the first and second conductive regions are disposed on the circuit board, the feedthrough terminal extends through the circuit board opening, and the plurality of capacitors are mounted to the circuit board.

12. The assembly of claim 11 wherein the support plate is a first support plate, the assembly further comprising a second support plate, the first support plate and the second support plate positioned on opposing sides of the circuit board, the first support plate mechanically connected to the second support plate.

13. The assembly of claim 11 wherein the circuit board is a printed circuit board and the first conductive region and the second conductive region are traces on the printed circuit board.

14. The assembly of claim 1 wherein the support plate includes a projecting flange for aligning the assembly with the opening in the mount.

15. The assembly of claim 1 wherein the assembly is attached to the mount with the feedthrough terminal extending through the opening and the second conductive region coupled to ground.

16. The assembly of claim 1 wherein the plurality of capacitors is 40 capacitors.

17. The assembly of claim 1 wherein each capacitor has a capacitance of about 100 nanofarads.

18. The assembly of claim 1 wherein the plurality of capacitors is greater than four.

19. The assembly of claim 1 wherein each capacitor has about the same capacitance as each of the other capacitors.

20. The assembly of claim 1 further comprising a circuit board having an opening, wherein the first and second conductive regions are disposed on the circuit board, the feedthrough terminal extends through the circuit board opening, and the plurality of capacitors are mounted to the circuit board.

\* \* \* \* \*